US012757684B2

(12) United States Patent
Terashima et al.

(10) Patent No.: US 12,757,684 B2
(45) Date of Patent: Oct. 6, 2026

(54) SUBSTRATE FIXING DEVICE

(71) Applicant: SHINKO ELECTRIC INDUSTRIES CO., LTD., Nagano (JP)

(72) Inventors: Yuma Terashima, Nagano (JP); Shun Takagi, Nagano (JP); Keita Sato, Nagano (JP); Yohei Yamada, Nagano (JP); Yuta Naito, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 175 days.

(21) Appl. No.: 18/772,089

(22) Filed: Jul. 12, 2024

(65) Prior Publication Data

US 2025/0022741 A1 Jan. 16, 2025

(30) Foreign Application Priority Data

Jul. 14, 2023 (JP) ................................ 2023-115734

(51) Int. Cl.
*H10P 72/72* (2026.01)
*H01J 37/32* (2006.01)

(52) U.S. Cl.
CPC ...... *H10P 72/722* (2026.01); *H01J 37/32724* (2013.01); *H01J 2237/2007* (2013.01); *H01J 2237/334* (2013.01)

(58) Field of Classification Search
CPC ......... H01J 37/32724; H01J 2237/2007; H01J 2237/334; H10P 72/0432; H10P 72/0434; H10P 72/72; H10P 72/722
USPC ........................................................ 361/234
See application file for complete search history.

(56) References Cited

U.S. PATENT DOCUMENTS

| | | | | |
|---|---|---|---|---|
| 2011/0058303 | A1* | 3/2011 | Migita | H10P 72/722<br>156/60 |
| 2013/0148253 | A1* | 6/2013 | Komatsu | H10P 72/722<br>361/234 |
| 2018/0047604 | A1* | 2/2018 | Takemoto | H10P 72/72 |

FOREIGN PATENT DOCUMENTS

| | | |
|---|---|---|
| JP | 2013-511162 A | 3/2013 |

* cited by examiner

*Primary Examiner* — Kevin J Comber
(74) *Attorney, Agent, or Firm* — Rankin, Hill & Clark LLP

(57) ABSTRACT

A substrate fixing device includes a base plate, an adhesive layer provided on the base plate, a heat insulating layer provided on the adhesive layer, and an electrostatic chuck provided on the heat insulating layer. The electrostatic chuck includes a base and an electrostatic electrode provided in the base, and the heat insulating layer has a lower thermal conductivity than the base and the adhesive layer.

6 Claims, 3 Drawing Sheets

CROSS-SECTIONAL VIEW ILLUSTRATING SIMPLIFIED EXAMPLE OF SUBSTRATE FIXING DEVICE ACCORDING TO MODIFICATION 1 OF FIRST EMBODIMENT

CROSS-SECTIONAL VIEW ILLUSTRATING SIMPLIFIED EXAMPLE OF SUBSTRATE FIXING DEVICE ACCORDING TO FIRST EMBODIMENT

CROSS-SECTIONAL VIEW ILLUSTRATING SIMPLIFIED EXAMPLE OF SUBSTRATE FIXING DEVICE ACCORDING TO MODIFICATION 1 OF FIRST EMBODIMENT

CROSS-SECTIONAL VIEW ILLUSTRATING SIMPLIFIED EXAMPLE OF SUBSTRATE FIXING DEVICE ACCORDING TO SECOND EMBODIMENT

SUBSTRATE FIXING DEVICE

CROSS-REFERENCE TO RELATED APPLICATIONS

This application claims priority from Japanese Patent Application No. 2023-115734, filed on Jul. 14, 2023, the entire content of which is incorporated herein by reference.

TECHNICAL FIELD

The present invention relates to a substrate fixing device.

BACKGROUND ART

In the related art, a film forming apparatus (for example, a CVD apparatus or a PVD apparatus) or a plasma etching apparatus used in manufacturing a semiconductor device such as an IC or an LSI includes a stage for accurately holding a wafer in a vacuum processing chamber.

As such a stage, for example, a substrate fixing device has been proposed that suctions and holds a wafer as an object to be suctioned by an electrostatic chuck mounted on a base plate via an adhesive layer. Examples of the substrate fixing device include a substrate fixing device having a structure provided with a heating element for adjusting the temperature of the wafer. In the substrate fixing device, a heat insulating layer may be provided on the base plate.

SUMMARY OF INVENTION

In the substrate fixing device having the structure described above, it is required to prevent the adhesive layer from deteriorating and to make it difficult for heat to escape to the base plate side.

The present invention has been made in view of the above circumstances, and the object of the present invention is to provide a substrate fixing device having a structure in which an adhesive layer is not likely to deteriorate and heat is not likely to escape to the base plate side.

According to an aspect of the present disclosure, there is provided a substrate fixing device including a base plate, an adhesive layer provided on the base plate, a heat insulating layer provided on the adhesive layer, and an electrostatic chuck provided on the heat insulating layer. The electrostatic chuck includes a base and an electrostatic electrode provided in the base, and the heat insulating layer has a lower thermal conductivity than the base and the adhesive layer.

According to the disclosed technique, it is possible to provide a substrate fixing device having a structure in which an adhesive layer is not likely to deteriorate and heat is not likely to escape to the base plate side.

DESCRIPTION OF EMBODIMENTS

Figure 1:
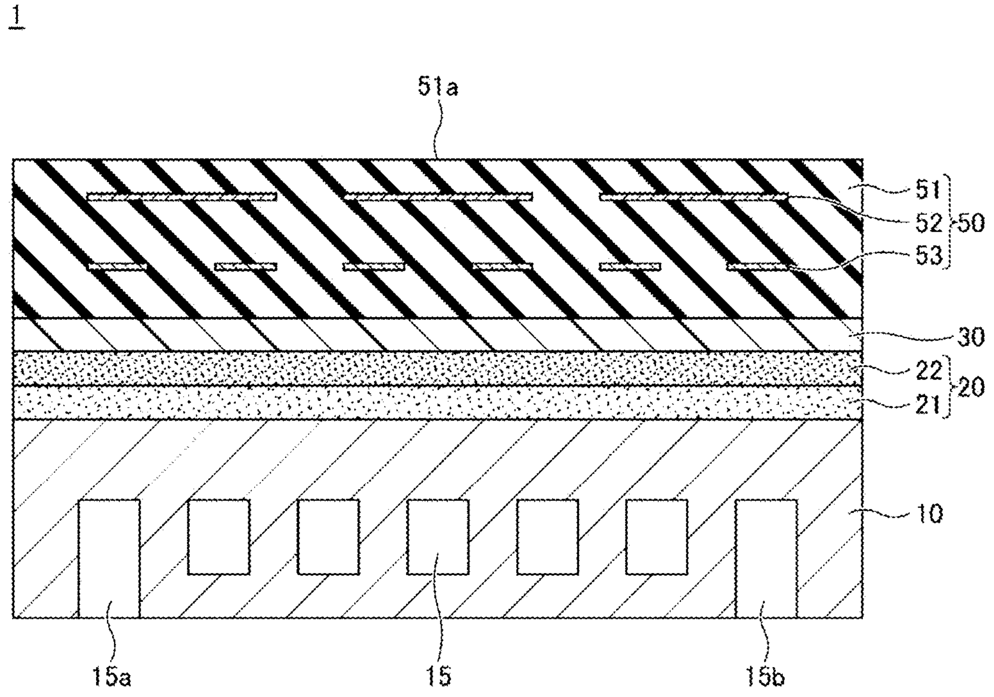
FIG. 1 is a cross-sectional view illustrating a simplified example of a substrate fixing device according to a first embodiment.

Hereinafter, embodiments of the present invention will be described with reference to the drawings. In the drawings, the same components are denoted by the same reference signs, and the redundant description thereof may be omitted.

First Embodiment

Structure of Substrate Fixing Device

FIG. 1 is a cross-sectional view illustrating a simplified example of a substrate fixing device according to a first embodiment. With reference to FIG. 1, a substrate fixing device 1 includes, as main components, a base plate 10, an adhesive layer 20, a heat insulating layer 30, and an electrostatic chuck 50.

The base plate 10 is a member on which the electrostatic chuck 50 is mounted. The thickness of the base plate 10 can be, for example, approximately 20 mm or more and 50 mm or less. The base plate 10 can be made of, for example, metal such as aluminum, copper, or titanium. Among these, it is preferable to use aluminum, which is inexpensive and easy to process.

The base plate 10 can also be used as an electrode or the like for controlling plasma. By supplying a predetermined high frequency power to the base plate 10, it is possible to control the energy for causing generated ions or the like in the plasma state to collide with the wafer suctioned on the electrostatic chuck 50, and to effectively perform the etching processing.

A flow path 15 may be formed inside the base plate 10. The flow path 15 includes a cooling medium introducing portion 15*a* at one end and a cooling medium discharging portion 15*b* at the other end. The flow path 15 is connected to a cooling medium control device (not shown) provided outside the substrate fixing device 1. The cooling medium control device (not shown) introduces the cooling medium from the cooling medium introducing portion 15*a* into the flow path 15, and discharges the cooling medium from the cooling medium discharging portion 15*b*. By circulating the cooling medium through the flow path 15 and cooling the base plate 10, the wafer suctioned on the electrostatic chuck 50 can be cooled. For example, water or Galden may be used as the cooling medium. In addition to the flow path 15, the base plate 10 may be provided with a gas channel or the like for introducing an inert gas to cool the wafer suctioned on the electrostatic chuck 50.

The electrostatic chuck 50 is mounted on the base plate 10 via the adhesive layer 20 and the heat insulating layer 30. The adhesive layer 20 and the heat insulating layer 30 are provided on the base plate 10, and the electrostatic chuck 50 is provided on the heat insulating layer 30. The adhesive layer 20 and the heat insulating layer 30 will be described later.

The electrostatic chuck 50 is a portion that suctions and holds a wafer as an object to be suctioned. The planar shape of the electrostatic chuck 50 can be, for example, circular. The diameter of the wafer that is the object to be suctioned by the electrostatic chuck 50 can be, for example, approximately 8 inches, 12 inches, or 18 inches. The electrostatic chuck 50 includes at least a base 51 and an electrostatic electrode 52. In the example in FIG. 1, the electrostatic chuck 50 further includes a heating element 53. The electrostatic chuck 50 is, for example, a Johnsen-Rahbek type electrostatic chuck. However, the electrostatic chuck 50 may be a Coulomb force type electrostatic chuck.

The base 51 is a dielectric material, and as the base 51, for example, ceramics such as aluminum oxide ($Al_2O_3$) or aluminum nitride (AlN) can be used. The thickness of the base 51 may be, for example, approximately 1 mm to 10 mm, and the dielectric constant (1 kHz) of the base 51 may be, for example, approximately 9 to 10.

The electrostatic electrode 52 is a thin film electrode and is provided in the base 51. The electrostatic electrode 52 is connected to a power source provided outside the substrate fixing device 1, and when a predetermined voltage is applied from the power source, generates an electrostatic suctioning force between the electrostatic electrode 52 and the wafer. Accordingly, the wafer can be suctioned and held on a placement surface 51*a* of the base 51 of the electrostatic chuck 50. The suctioning and holding force becomes stronger as the voltage applied to the electrostatic electrode 52 becomes higher. The electrostatic electrode 52 may have a monopolar shape or a bipolar shape. As the material of the electrostatic electrode 52, for example, tungsten (W) or molybdenum (Mo) can be used.

The heating element 53 is provided in the base 51 on a side that is closer to the base plate 10 than is the electrostatic electrode 52. The heating element 53 generates heat by applying a voltage from outside the substrate fixing device 1, and heats the placement surface 51*a* of the base 51 to a predetermined temperature. For example, the heating element 53 can heat the placement surface 51*a* of the base 51 to approximately 250° C. or higher and 400° C. or lower. As the material of the heating element 53, for example, tungsten or molybdenum can be used. The heating element 53 may be, for example, a concentric circular pattern.

The adhesive layer 20 is provided on the base plate 10. The adhesive layer 20 has, for example, a single-layer structure. The thermal conductivity of the adhesive layer 20 is preferably 2 W/mK or more. As the material of the adhesive layer 20, for example, a silicone adhesive can be used. The thickness of the adhesive layer 20 is preferably equal to or larger than the thickness of the heat insulating layer 30. The thickness of the adhesive layer 20 may be, for example, 0.1 mm or more and 3.0 mm or less.

The adhesive layer 20 may have a laminated structure. In the example in FIG. 1, the adhesive layer 20 has a laminated structure in which a second adhesive layer 22 is laminated on a first adhesive layer 21. For example, the second adhesive layer 22 is formed of an adhesive having a low elastic modulus, and the first adhesive layer 21 is formed of an adhesive having a high elastic modulus. Accordingly, it is possible to attain an effect of reducing the stress caused by the difference in thermal expansion between the metal base plate 10 and the ceramic base 51. As the material of the first adhesive layer 21, for example, a silicone adhesive or an epoxy adhesive can be used. As the material of the second adhesive layer 22, for example, a silicone adhesive or an epoxy adhesive can be used.

The heat insulating layer 30 is provided on the adhesive layer 20. The thermal conductivity of the heat insulating layer 30 is lower than that of the base 51 and the adhesive layer 20 constituting the electrostatic chuck 50. The thickness of the heat insulating layer 30 may be, for example, 0.1 mm or more and 2.0 mm or less. By providing the heat insulating layer 30 closer to the electrostatic chuck 50 than is the adhesive layer 20, the heat generated by the heating element 53 can be prevented from being transmitted to the adhesive layer 20. Accordingly, the adhesive layer 20 is less likely to lose weight due to deterioration or decomposition of the adhesive layer 20, and the base 51 is prevented from peeling off from the base plate 10.

The thickness of the heat insulating layer 30 and the thermal conductivity of the heat insulating layer 30 can be determined in consideration of an increase in thermal resistance of the heat insulating layer 30. Details will be shown in the simulation described below, and for example, when the temperature in the vicinity of the placement surface 51*a* of the base 51 is 250° C., in a case in which it is desired to keep the temperature applied to the adhesive layer 20 at 180° C. or lower, if the thickness of the heat insulating layer 30 is 1 mm, the thermal conductivity can be made 1 W/mK or less. When the thickness of the heat insulating layer 30 is 0.1 mm, the thermal conductivity can be made 0.1 W/mK or less.

If the heat insulating layer 30 is not provided, when the temperature in the vicinity of the placement surface 51*a* of the base 51 reaches a high temperature of approximately 250° C. or higher and 400° C. or lower, the adhesive layer 20 also reaches a similar high temperature. Therefore, a weight loss occurs in the adhesive layer 20, and the chance increases that the adhesive layer 20 is destroyed and the base 51 peels off from the base plate 10.

The weight loss rate of the adhesive layer 20 obtained based on TGDTA measurement at 250° C. is preferably 0 or more and 0.1% or less. In other words, the material, the thickness, and the thermal conductivity of the heat insulating layer 30 are preferably selected such that the weight loss rate of the adhesive layer 20 obtained based on the TGDTA measurement at 250° C. is 0 or more and 0.1% or less. Since the adhesive layer 20 is less likely to be destroyed, peeling of the base 51 from the base plate 10 can be prevented. The TGDTA measurement is a method for simultaneously analyzing the thermal weight and the differential heat, and it is possible to change the temperature of a sample and simultaneously measure the accompanying weight change and endothermic and exothermic reactions.

As the material of the heat insulating layer 30, for example, an insulating resin containing a filler, such as a silicone insulating resin or an epoxy insulating resin, can be used. By adjusting the composition of the material and the type and content of the filler, the thermal conductivity described above can be achieved.

By providing the heat insulating layer 30, the heat generated by the heating element 53 can be prevented from escaping to the base plate 10 side. By increasing the thickness of the adhesive layer 20, it is possible to further prevent the heat generated by the heating element 53 from escaping to the base plate 10 side.

Modification 1 of First Embodiment

In a modification 1 of the first embodiment, an example of a substrate fixing device including a sealing material is illustrated. In the modification 1 of the first embodiment, the description of the same components as those of the already described embodiment may be omitted.

Figure 2:
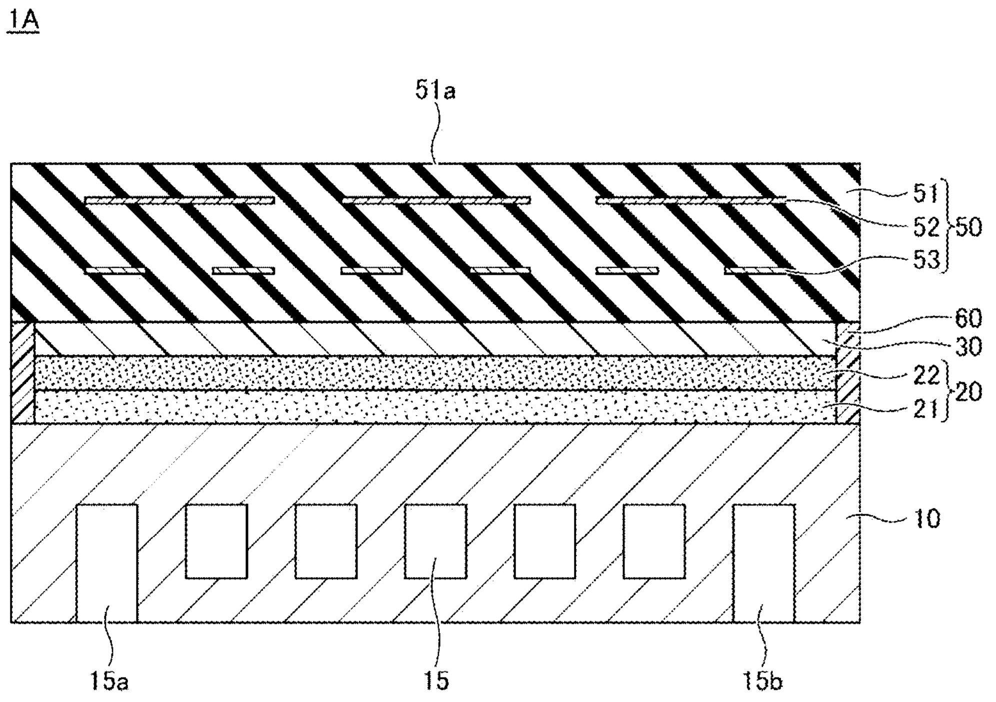
FIG. 2 is a cross-sectional view illustrating a simplified example of a substrate fixing device according to a modification 1 of the first embodiment.

FIG. 2 is a cross-sectional view illustrating a simplified example of the substrate fixing device according to the modification 1 of the first embodiment. As illustrated in FIG. 2, the substrate fixing device 1A is different from the substrate fixing device 1 in that the substrate fixing device 1A includes a sealing material 60.

In the substrate fixing device 1A, the adhesive layer 20 and the heat insulating layer 30 annularly expose the outer peripheral portion of the base plate 10. The sealing material 60 that covers the outer peripheral surfaces of the adhesive layer 20 and the heat insulating layer 30 is provided on the annularly exposed region of the outer peripheral portion of the base plate 10. The upper surface of the sealing material 60 is in close contact with the lower surface of the base 51, and the lower surface of the sealing material 60 is in close contact with the upper surface of the base plate 10. As the sealing material 60, for example, an O ring or the like can be used. A resin having higher plasma resistance than the adhesive layer 20 and the heat insulating layer 30 may be used as the sealing material 60.

In this way, the sealing material 60 is provided such that the adhesive layer 20 and the heat insulating layer 30 are not exposed to the outside of the substrate fixing device 1A. Accordingly, during plasma etching or the like, the adhesive layer 20 and the heat insulating layer 30 can be hermetically isolated from the plasma. Therefore, deterioration of the adhesive layer 20 and the heat insulating layer 30 can be prevented.

Second Embodiment

In a second embodiment, an example of a substrate fixing device is illustrated in which a heating element is provided on the lower side of an electrostatic chuck. In the second embodiment, the description of the same components as those of the already described embodiment may be omitted.

Figure 3:
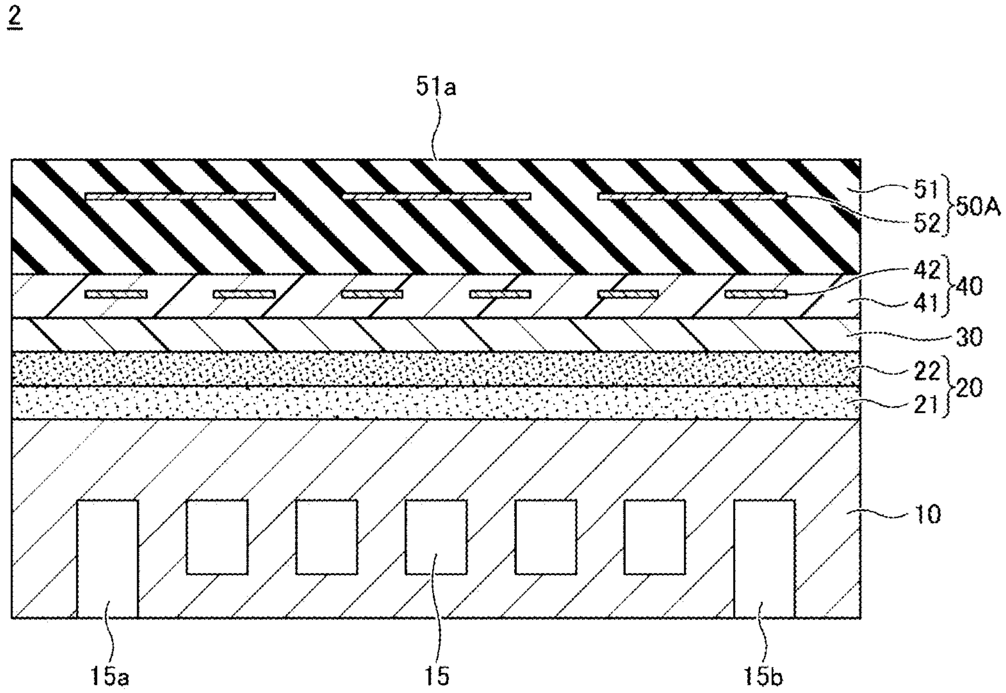
FIG. 3 is a cross-sectional view illustrating a simplified example of a substrate fixing device according to a second embodiment.

FIG. 3 is a cross-sectional view illustrating a simplified example of the substrate fixing device according to the second embodiment. As illustrated in FIG. 3, the substrate fixing device 2 is different from the substrate fixing device 1 mainly in that the substrate fixing device 2 includes a heating portion 40.

In the substrate fixing device 2, an electrostatic chuck 50A is different from the electrostatic chuck 50 in that the electrostatic chuck 50A does not include a heating element. In the substrate fixing device 2, the heating portion 40 is provided on the lower side of the electrostatic chuck 50A.

The heating portion 40 includes an insulating resin layer 41 provided between the base 51 of the electrostatic chuck 50A and the heat insulating layer 30, and a heating element 42 provided in the insulating resin layer 41. In the heating portion 40, the periphery of the heating element 42 is covered with the insulating resin layer 41 and is protected from the outside.

As the insulating resin layer 41, for example, epoxy resin or bismaleimide triazine resin having high thermal conductivity and high heat resistance can be used. The thermal conductivity of the insulating resin layer 41 is preferably 3 W/mK or more. By containing a filler such as alumina or aluminum nitride in the insulating resin layer 41, the thermal conductivity of the insulating resin layer 41 can be improved. The glass transition temperature (Tg) of the insulating resin layer 41 is preferably 250° C. or higher. The thickness of the insulating resin layer 41 is preferably approximately 100 μm to 150 μm, and the thickness variation of the insulating resin layer 41 is preferably ±10% or less.

The heating element 42 generates heat by applying a voltage from outside the substrate fixing device 2, and heats the placement surface 51*a* of the base 51 to a predetermined temperature. For example, the heating element 42 can heat the placement surface 51*a* of the base 51 to approximately 250° C. or higher and 400° C. or lower. As the material of the heating element 42, for example, copper (Cu), tungsten (W), nickel (Ni), aluminum (Al), constantan (an alloy of Cu/Ni/Mn/Fe), geranin (an alloy of Cu/Mn/Sn), and manganin (an alloy of Cu/Mn/Ni) can be used. The heating element 42 may be, for example, a concentric circular pattern.

In order to improve the adhesion between the heating element 42 and the insulating resin layer 41 at a high temperature, it is preferable that at least one surface (one or both of the upper and lower surfaces) of the heating element 42 is roughened. Of course, both the upper and lower surfaces of the heating element 42 may be roughened. In this case, different roughening methods may be used for the upper surface and the lower surface of the heating element 42. The roughening method is not particularly limited, and examples thereof include a method using etching, a method using a coupling agent-based surface modification technique, and a method using dot processing using a UV-YAG laser having a wavelength of 355 nm or less.

The thermal conductivity of the heat insulating layer 30 is lower than that of the base 51, the adhesive layer 20, and the insulating resin layer 41. Accordingly, similarly to the first embodiment, it is possible to prevent the heat generated by the heating element 42 from being transmitted to the adhesive layer 20. The heat generated by the heating element 42 can be prevented from escaping to the base plate 10 side. By increasing the thickness of the adhesive layer 20, it is possible to further prevent the heat generated by the heating element 42 from escaping to the base plate 10 side.

Simulation

When the substrate fixing device 1 is operated such that the temperature of the placement surface 51*a* of the base 51 is 250° C. and the cooling temperature of the cooling medium in the flow path 15 is 70° C., a simulation was performed regarding the condition for the heat insulating layer 30 so that the maximum temperature of the upper portion of the adhesive layer 20 is 180° C. or lower.

Specifically, a simulation was performed for the case in which the heat insulating layer 30 was not provided and the case in which the thickness of the heat insulating layer 30 was 1.0 mm and the thermal conductivity of the heat insulating layer 30 was 2 W/mK, 1 W/mK, and 0.5 W/mK. In the simulation, the maximum temperature of the adhesive layer 20 and the increase in the thermal resistance of the heat insulating layer 30 were calculated. For reference, the output required when the temperature of the placement surface 51*a* of the base 51 is set to 250° C. was obtained.

TABLE 1

| Thermal conductivity of heat insulating layer | No heat insulating layer | 2 W/mK | 1 W/mK | 0.5 W/mK |
|---|---|---|---|---|
| Increase in thermal resistance of heat insulating layer | — | 0.0005 $m^2K/W$ | 0.001 $m^2K/W$ | 0.002 $m^2K/W$ |
| Output required for 250° C. | — | 6411 | 5260 | 3926 |
| Maximum temperature of upper portion of adhesive layer | 230° C. | 203° C. | 180° C. | 159° C. |

The result is shown in Table 1. As shown in Table 1, according to the simulation, it was found that the maximum temperature of the upper portion of the adhesive layer 20 was 230° C. in the absence of the heat insulating layer 30. It was found that, when the thickness of the heat insulating layer 30 was 1.0 mm and the thermal conductivity was 1 W/mK, the maximum temperature of the upper portion of the adhesive layer 20 was 180° C., which was 50° C. lower than that in the absence of the heat insulating layer 30. At this time, the increase in the thermal resistance of the heat insulating layer 30 was 0.001 $m^2K/W$.

Here, the simulation was performed for the case in which the thickness of the heat insulating layer 30 was 1.0 mm. However, by using the calculated increase (0.001 $m^2K/W$) in the thermal resistance of the heat insulating layer 30, even when the thickness of the heat insulating layer 30 is other than 1.0 mm, the thermal conductivity required to cause the maximum temperature of the upper portion of the adhesive layer 20 to be 180° C. can be obtained. For example, when the thickness of the heat insulating layer 30 is 0.1 mm, 0.1 [mm]/0.001 [$m^2K/W$]=0.1 [W/mK], and when the thermal conductivity of the heat insulating layer 30 is 0.1 [W/mK], the maximum temperature of the upper portion of the adhesive layer 20 becomes 180° C.

In this way, the thickness of the heat insulating layer 30 and the thermal conductivity of the heat insulating layer 30 can be determined such that the increase in the thermal resistance of the heat insulating layer 30 is 0.001 $m^2K/W$ or less. Accordingly, even when the temperature in the vicinity of the placement surface 51*a* of the base 51 becomes 250° C., the temperature applied to the adhesive layer 20 can be reduced to 180° C. or lower. Accordingly, the adhesive layer 20 is less likely to lose weight due to deterioration or decomposition of the adhesive layer 20, and the base 51 is prevented from peeling off from the base plate 10.

When the temperature in the vicinity of the placement surface 51*a* of the base 51 is 400° C. or the like, the thickness and the thermal conductivity required for the heat insulating layer 30 can be obtained by the same method as described above.

Although the preferred embodiments and the like have been described in detail, the present invention is not limited to the embodiments and the like described above, and various modifications and substitutions can be made to the embodiments and the like described above without departing from the scope of the claims.

For example, as the object to be suctioned of the substrate fixing device according to the present invention, a glass substrate or the like used in the manufacturing process of a liquid crystal panel or the like may be exemplified in addition to a semiconductor wafer (a silicon wafer or the like).

What is claimed is:

1. A substrate fixing device comprising:
a base plate;
an adhesive layer provided on the base plate;
a heat insulating layer provided on the adhesive layer;
an electrostatic chuck provided on the heat insulating layer;
an insulating resin layer provided between the base layer and the heat insulating layer; and
a heating element provided in the insulating resin layer,
wherein the electrostatic chuck includes a base and an electrostatic electrode provided in the base,
wherein the heat insulating layer has a lower thermal conductivity than the base and the adhesive layer,
wherein the heat insulating layer has a lower thermal conductivity than the insulating resin layer, and
wherein the heating element is not exposed from the upper surface of the insulating resin layer.

2. The substrate fixing device according to claim 1,
wherein a thickness of the adhesive layer is equal to or larger than a thickness of the heat insulating layer.

3. The substrate fixing device according to claim 1, further comprising
a heating element provided in the base.

4. The substrate fixing device according to claim 1,
wherein the adhesive layer has a laminated structure in which a second adhesive layer is laminated on a first adhesive layer.

5. The substrate fixing device according to claim 4,
wherein the first adhesive layer is formed of an adhesive having a higher elastic modulus than the second adhesive layer.

6. The substrate fixing device according to claim 1,
wherein the adhesive layer and the heat insulating layer annularly expose an outer peripheral portion of the base plate, and
wherein a sealing material that covers an outer peripheral surface of the adhesive layer and the heat insulating layer is provided on an annularly exposed region of the outer peripheral portion of the base plate.

* * * * *